(12) United States Patent
Lynch et al.

(10) Patent No.: US 6,380,922 B1
(45) Date of Patent: Apr. 30, 2002

(54) ELECTRONIC DISPLAY

(75) Inventors: Anne T. Lynch, Needham; Jeffrey S. Hewes, Holliston; Mark Kacprowicz, Natick, all of MA (US)

(73) Assignee: The Gillette Company, Boston, MA (US)

( * ) Notice: Subject to any disclaimer, the term of this patent is extended or adjusted under 35 U.S.C. 154(b) by 0 days.

(21) Appl. No.: 09/293,013

(22) Filed: Apr. 16, 1999

(51) Int. Cl.[7] ................................................. G09G 3/34
(52) U.S. Cl. ........................................ 345/107; 324/435
(58) Field of Search ................................ 345/107, 212, 345/108, 205; 359/86; 324/435

(56) References Cited

U.S. PATENT DOCUMENTS

| | | | |
|---|---|---|---|
| 3,892,568 A | * 7/1975 | Ota | 96/1.3 |
| 4,027,231 A | 5/1977 | Lohrmann | 324/29.5 |
| 4,419,663 A | * 12/1983 | Kohashi | 340/783 |
| 5,202,063 A | 4/1993 | Andrews et al. | 264/4.6 |
| 5,225,104 A | 7/1993 | Van Steenkiste et al. | 252/299.01 |
| 5,285,299 A | 2/1994 | Drzaic et al. | 359/52 |
| 5,389,470 A | 2/1995 | Parker et al. | 429/90 |
| 5,397,503 A | 3/1995 | Yuasa et al. | 252/299.01 |
| 5,428,370 A | 6/1995 | Knapp et al. | 345/205 |
| 5,460,902 A | 10/1995 | Parker et al. | 429/90 |
| 5,582,700 A | * 12/1996 | Bryning et al. | 204/450 |
| 5,610,511 A | * 3/1997 | Parker | 324/106 |
| 5,719,450 A | * 2/1998 | Vora | 307/116 |
| 6,118,426 A | * 9/2000 | Albert et al. | 345/107 |

FOREIGN PATENT DOCUMENTS

| | | |
|---|---|---|
| EP | 0 296 662 A2 | 12/1998 |
| JP | 10-268798 | 9/1998 |
| WO | WO 99/05745 | 2/1999 |
| WO | WO 00/26761 | 5/2000 |

OTHER PUBLICATIONS

"All Printed Bistable Reflective Displays: Printable Electrophoretic Ink and All Printed Metal–Insulator–Metal Diodes", Massachusetts Institute of Technology, 6/98, pp. 1–19.
"Electrophoretic Displays", J.C. Lewis, 1976, pp. 223–240.
?Electrophoretic Displays, A.L. Dalisa, pp. 213–232.
"The Reinvention of Paper", Scientific American, 9/98, pp. 36, 40.
"An Electrophoretic Ink for All–Printed Reflective Electronic Displays", Comiskey et al., Nature, vol. 394, Jul. 16, 1998; pp. 253–255.
"Electronic Ink: A printable display system", Comiskey et al., 6/97, pp. 1–3.
"Easy Reader", J. Wilson, Popular Mechanics, 11/98, pp. 94–96, 98.

* cited by examiner

*Primary Examiner*—Bipin Shalwala
*Assistant Examiner*—Vanel Frenel
(74) *Attorney, Agent, or Firm*—Fish & Richardson P.C.

(57) ABSTRACT

A voltage controlled display is described. The voltage controlled display is a low voltage display and has a display element having a pair of electrodes and a voltage divider having a terminal coupled to a first one of the pair of electrodes of the voltage controlled display. A metal-insulator-metal diode having a switching voltage less than about 10 volts coupled to the voltage divider. In a preferred embodiment, the display element further includes a second metal-insulator-metal device and wherein the voltage divider includes a resistor coupled in series with the second metal-insulator-metal diode.

17 Claims, 9 Drawing Sheets

ELECTRONIC DISPLAY

BACKGROUND

This invention relates to voltage controlled electronic displays.

One type of voltage controlled display is an electrophoretic display device such as described in "All Printed Bistable Reflective Displays: Printable Electrophoretic Ink and All Printed Metal-Insulator-Metal Diodes" Massachusetts Institute of Technology June 1998 and provided by E-INK, Inc. Cambridge, Mass. This type of display is based on so called "electronic inks," e.g., electrophoretic materials that change their properties based on an applied voltage. Using electrophoretic materials such as electronic ink, a flat panel display can be printed on a substrate material. These displays draw very little current and hence dissipate very little power. Any voltage sensitive material could be used as the display. Another material that has described in "The Reinvention of Paper", Scientific American, September 1996, called Gyricon which is also voltage sensitive. Both of these types of displays operate at relatively high voltages.

A metal-insulator-metal diode (M-I-M) diode exhibits current-voltage characteristics similar to a semiconductor diode. One distinction from semiconductor diode current-voltage characteristics is that the current-voltage characteristics of a M-I-M diode are symmetrical. Typical the current-voltage characteristic curve of an M-I-M diode is bipolar. That is, at a predetermined negative voltage and a substantially the same predetermined positive voltage, the diode can switch between non-conducting and conducting states.

One type of metal-insulator-metal diode includes a composite metal-insulating layer that spaces two conductive layers, i.e., electrodes. The composite metal/insulating layer has an insulating binder, suspending metal particles having a relatively thick, thermally grown or deposited oxide layer on the metal particles. In the above thesis of Jaeyong Park two types of processes for producing such metal-insulator-metal diodes are described. The diodes produced from this work exhibit relatively high switching voltages.

SUMMARY

According to an aspect of the present invention, a voltage controlled display includes a display element having a pair of electrodes and a voltage divider having a terminal coupled to a first one of the pair of electrodes of the voltage controlled display. The voltage controlled display also includes a metal-insulator-metal diode having a switching voltage less than about 10 volts coupled to the voltage divider. The voltage controlled display of claim 1 wherein the voltage divider includes a pair of resistors having the same resistance.

The voltage controlled display can have a voltage potential at the first terminal of the display element that is a fraction of a signal line voltage and a potential at the second terminal of the display element determined by a voltage across the nonlinear element and resistor. The voltage controlled display can include a second metal-insulator-metal device coupled in series with a resistor coupled. In this arrangement, a voltage potential at the first terminal of the display element is a fixed, fraction of a signal line voltage and a potential at the second terminal of the display element is determined by a voltage at a connection of the nonlinear element and resistor.

According to an additional aspect of the present invention, a voltage controlled display includes a plurality of display cells coupled in an array. Each cell of the array includes a display element having a pair of electrodes, a voltage divider having a terminal coupled to a first one of the pair of electrodes of the voltage controlled display and a metal-insulator-metal diode having a switching voltage less than about 10 volts coupled to the voltage divider.

One or more of the following advantages may be provided by one or more aspects of the invention. One advantage of the display compared to other displays is that is uses very little current and switches at low voltages. The display includes a voltage sensitive display and low voltage switching nonlinear element e.g., a low voltage metal-insulator-metal diode (M-I-M diode). The voltage sensitive display uses a material that switches based on the voltage. In addition, the display array, elements, resistors and nonlinear devices can all be fabricated using conventional and inexpensive printing techniques.

DESCRIPTION

Figure 1:
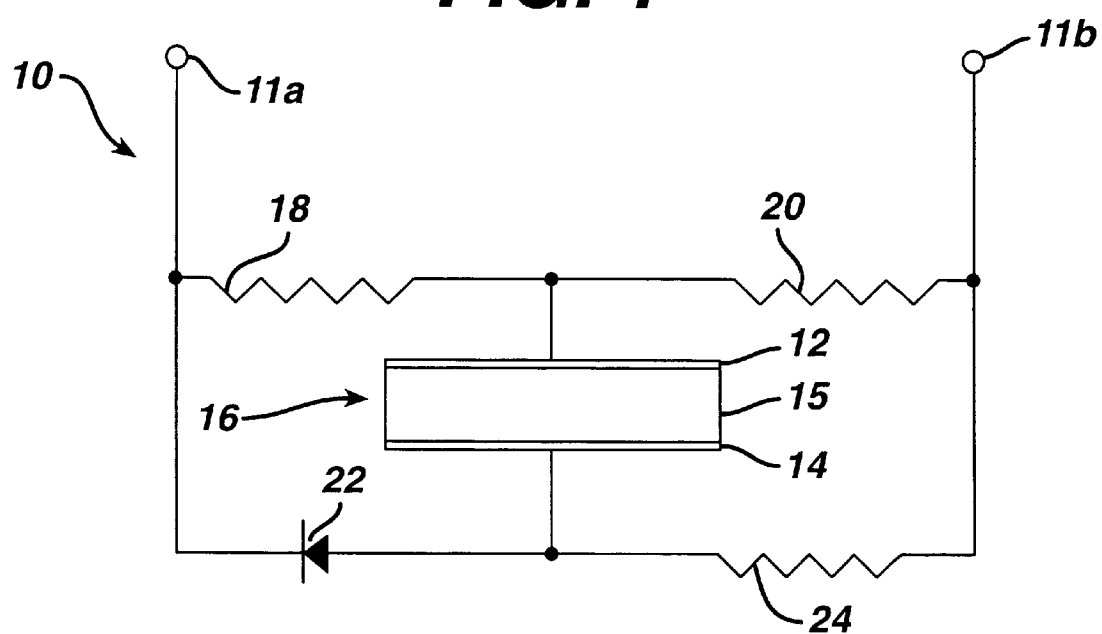
FIG. 1 is a schematic diagram of a voltage controlled, low voltage, low power display element.

Referring now to FIG. 1, a low power, low voltage display 10 is shown. The display 10 includes a pair of signal lines e.g. display terminals 11a, 11b. The display 10 is arranged as a parallel circuit including a display element 16. The display element 16 includes two electrodes 12, 14 sandwiching an electrophoretic ink layer 15. Electrode 12 is connected to the parallel circuit at a voltage divider provided by two resistors, 18 and 20. Electrode 14 is connected to the other side of the parallel circuit. The other side of the parallel circuit has a nonlinear element, i.e., a low voltage controllable, switch 22 implemented as a M-I-M diode and a third resistor 24. In a practical embodiment, the display 10 could be replicated many times and the display 10 could be arranged into an active matrix of such elements.

The display 10 is an ultra-low current, voltage controlled type of display. The electronic ink layer 15 is an electrophoretic material that changes properties based on an applied voltage. Using electrophoretic materials such as electronic ink layer 15, a flat panel display can be printed on a substrate material. This display 10 draws very little current operates at low voltages e.g., less than 10 volts and dissipates very little power. Any voltage sensitive material could be used as the display. Another material that has similar properties is described in "The Reinvention of Paper", Scientific American, September 1998 and is called Gyricon. Gyricon is also a voltage sensitive material. The display 10 operates at voltages that are within a range of less than 10 volts and in particular less than 0.5 to 1–2 volts and more particularly 0.5–1 volts.

The non-linear device 22 is a M-I-M diode as described below in conjunction with FIGS. 3–7D.

The voltage potential at terminal 12 will always have, half of the signal voltage difference from terminals 11a, 11b across it if the value of resistor 18 equals the value of resistor 20. The potential of the electrode 14 is determined by voltage across the nonlinear element 22 and resistor 24. The voltage at terminal 12 will vary based on the signal applied to terminal 11a with respect to the voltage at electrode 14. Since element 22 is non linear, at some point it will switch causing the voltage at electrode 12 to become negative with respect to the voltage of electrode 14. When the non-linear element switches, this would flip the polarity on the display element 16 causing the display element 16 to change color. By arranging a plurality of the display elements 16 a display 10 is provided that can be used to display various types of information.

Since the display 10 is a printed device, the non-linear device can be provided with carbon ink based electrodes, as described below. The resistors can also be carbon based and include a filler to reduce the conductivity of the resistors to make them more resistive. Ideally the entire display 10 should have a very high total resistance. For a cell it would be on the order of 15 meg-ohms.

Figure 1A:
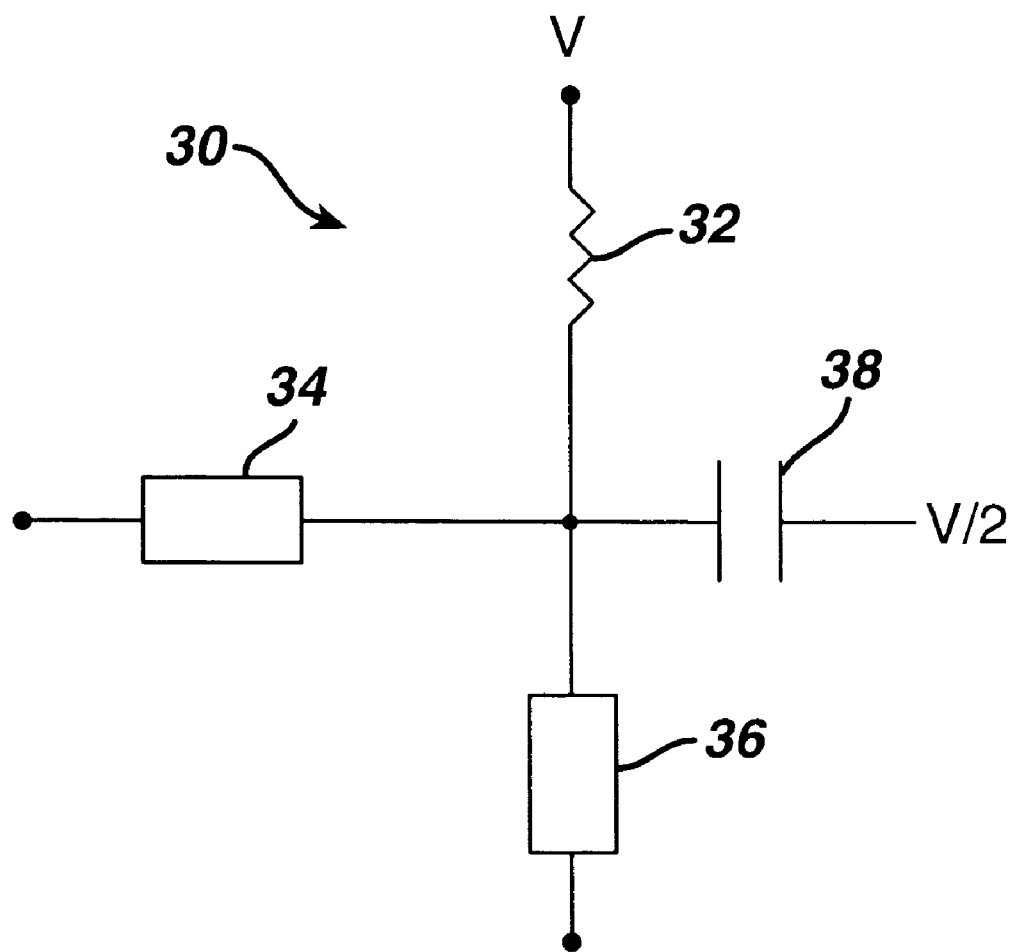
FIG. 1A is a schematic diagram of a preferred voltage controlled, low voltage, low power display element.

Referring now to FIG. 1A, an alternative display element 30 is shown. The display element 30 includes a voltage controlled display element 38 having one electrode 38a coupled to a fixed potential and a second electrode 38b coupled to a pair of non-linear switching elements 34 and 36 provided as M-I-M diodes as will be described below. The display element 30 also includes a resistor 32 that can be a printed film resistor having one end coupled to a supply potential V and a second end coupled to the common connection of the pair of non-linear switching elements 34, 36. The non-linear elements 34, 36 are used to couple the second electrode to either a +V potential or a reference potential e.g., ground, in order to switch potential differences across the display element 30 and causing the display to switch colors in response to the control signals fed to the pair of non-linear elements.

Figure 2:
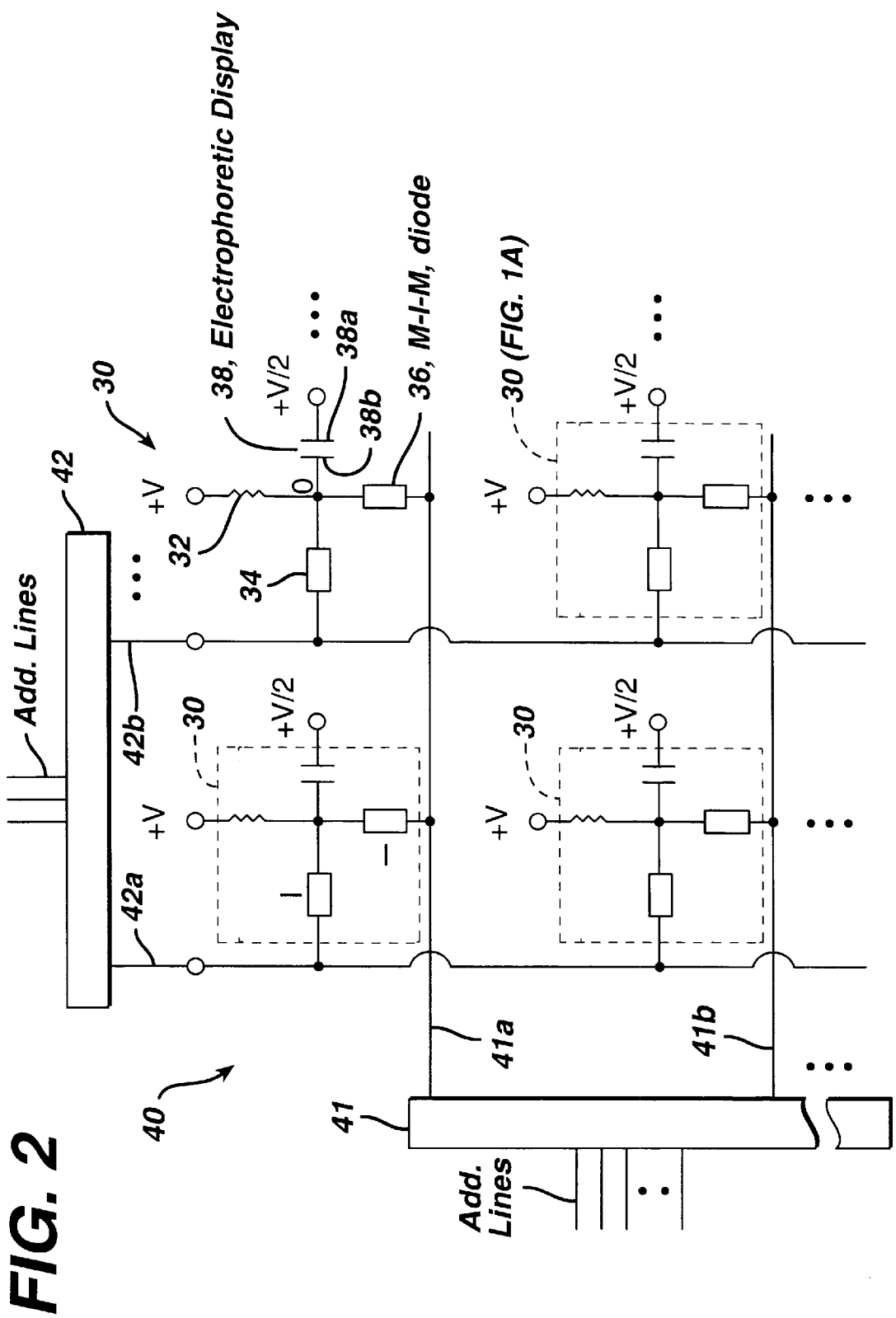
FIG. 2 is a schematic layout of a matrix of voltage controlled low power, low voltage display elements.

Referring now to FIG. 2, a plurality of the display elements 30 is shown coupled in an array 40. The plurality of display elements 30 have conductors coupled to row 41a–41b and column 42a–42b addressable lines. In a practical embodiment there could be many such row and column lines than the two shown. The row addressable lines 41a–41b are coupled to the M-I-M diode elements 36 in each corresponding one of the display elements 30 and the column addressable lines 42a–42b are coupled to the M-I-M diode elements 34 in each corresponding one of the display elements 30.

The array 40 also includes row drivers 41 and column drivers 42. The row drivers 41 and column drivers 42 are fed from signals from decoders (not shown) that decode an input signal into row and column signals on lines 41a–41bg and 42a–42b in order to control individual display elements 30. Thus, each individual display element 30 can be a corresponding pixel element in the display array 40. The array 40 works by having the drivers 41, 42 produce signals (that are at a reference potential or the supply potential) on the row lines 41a–41b and column lines 42a–42b to selectively flip a potential difference across individual display elements and hence change individual display element colors.

Taking the cell 30d as an example, the display element 30 will display one color e.g., white, when the value of potential at the second electrode 38b is less than the value of potential at the first electrode 38a, and will display a different color e.g., black, when the value of potential at the second electrode 38b is greater than the value of potential at the first electrode 38a. When one or both of the column 42b line and row line 41a, to the display cell element 30d are at a potential of 5 volts, the value of the potential at the second electrode 38b will be 5 volts and the display element 30 will be in the first state, e.g., white, because the first electrode 38a at the fixed potential V/2 will be less positive than the second electrode 38b.

In order to switch the state of the display element 38 signals are fed to the row and column drivers 41, 42 to cause corresponding row line 41a and column line 42b to both go to the reference potential of zero volts. This causes the diodes 34 and 36 to both switch providing a zero volt potential at the second electrode 38b of the display element 38. Since the second electrode 38b is now less positive than the first electrode 38a the display element will switch to the second color e.g. black.

Figure 3:
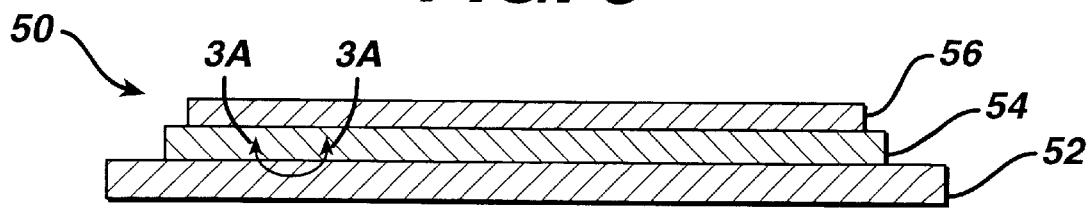
FIG. 3 is a cross-sectional view of an M-I-M diode structure.
Figure 3A:
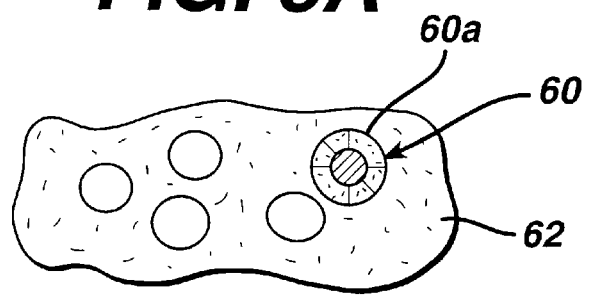
FIG. 3A is a blowup view taken along line 3A—3A of a portion of FIG. 3.

Referring now to FIG. 3, a metal-insulator-metal diode 50 suitable for the devices 22 (FIG. 1) 34 and 36 (FIG. 1A and 2) is shown. The metal-insulator-metal diode 50 includes a first electrode 52, e.g., a copper foil substrate or another conductive material such as carbon or gold or other conductive materials such as chromium, tungsten, molybdenum, or other conductive materials such as metal particles dispersed in a polymer binder such as a conductive ink. The metal-insulator-metal diode 50 further includes a composite metal-insulator layer 54 comprised of metal particles 60 suspended in a dielectric binding layer 62. As shown in FIG. 3A, the metal particles 60 have an intrinsic oxide layer 60a that covers the surface of the particles 60. One preferred metal is tantalum that readily forms an intrinsic, stable and generally uniform intrinsic oxide layer 60a. Other metals can be used such as niobium. These other metals should form oxides that are self-limiting, stable, and having a suitable dielectric constant for the application. One reason that tantalum is preferred is that the intrinsic oxide layer forms readily on tantalum upon its exposure to air.

Disposed on the composite metal-insulating layer 54 is a second electrode 56 also comprised of e.g., copper or another conductive materials such as a carbon, chromium, tungsten, molybdenum, or gold or other conductive materials. The second electrode is preferably disposed directly on the layer 52 to be in contact with the intrinsic oxide layer 60a on the particles 60. The second electrode also can be a composite layer including the conductive materials and a binder. By varying the conductivity of the electrode layer 56, the electrical characteristics of the device 50 can be changed. Specifically, the I-V characteristic curve can be made sharper to obtain a steeper on/off characteristic. That is, the higher the electrical conductivity, the sharper the curve.

As will be described below in FIGS. 7A–7D, the M-I-M device has a symmetrical current-voltage (I-V) characteristic curve exhibiting diode-like properties. The device also can be made to have lower switching voltages than other approaches, e.g., less than 10 volts and more specifically less than 1 volt to about 0.5 volts but with the same symmetrical properties. By varying the ratio of the tantalum to the binder and also the thickness of the tantalum-binder layer enables shifting of the I-V characteristic curve for the same material up or down within a range of plus/minus 50% or more.

The switching voltage of the device 50 can be more consistent from device to device. This may occur due in part to the more consistent oxide layer thickness and quality of the intrinsically formed oxide. The thickness of the tantalum oxide layer 60a does not vary widely compared to thermal annealing or anodized oxide layers. It is believed that the intrinsic layer 60a also has a substantially uniform thickness from tantalum particle 60 to tantalum particle 60 that is on the order of monolayers of thickness. Characteristics of the tantalum particles are that the powder has a particle size in a range less than 0.5 microns up to about 10's of microns. The printed layer 54 can have a thickness less than 0.5 mils up to 8–10 mils. Other particle sizes and thicknesses could be used herein.

Figure 4:
FIG. 4 is a cross-sectional view of an alternative M-I-M diode structure.
Figure 4A:
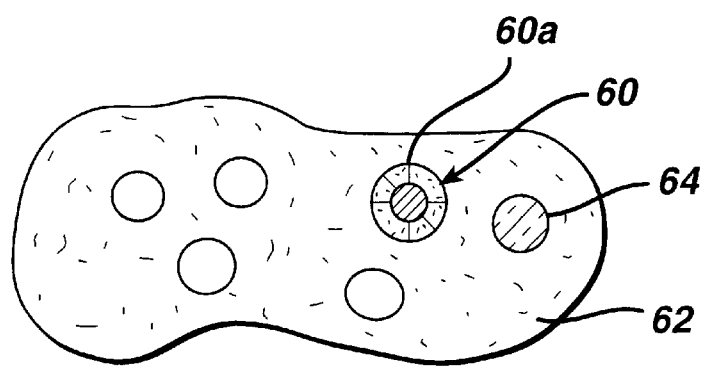
FIG. 4A is a blowup view taken along line 4A—4A of a portion of FIG. 4.

Referring now to FIG. 4, another embodiment 50' of the diode includes a layer 54' comprising inert particles 64 (as shown in FIG. 4A) of another dielectric material such as particles 64 of titanium dioxide $TiO_2$ or magnesium carbonate. $MgCO_3$ dispersed within the polymer binder 62 and the tantalum particles 60 having an oxide layer 60a. In this embodiment, a portion (e.g., 0% to 75%) of the tantalum particles 60 are replaced with inert dielectric material particles 64 such as the titanium dioxide or magnesium carbonate. The tantalum particles 60 can optionally have an annealed oxide or other type of oxide layer disposed about the tantalum although, the intrinsic oxide layer 60a alone is preferred.

The addition of dielectric particles of e.g., titanium dioxide solids to the polymer binder 62 and the tantalum particles 60 can improve printing of the layer 54', enabling use of lower amounts of tantalum particles while still maintaining a high solids content that would exhibit good diode properties. This would be particularly desirable with very thin layers of the metal/insulating material layer to avoid shorting of the two electrodes 52 and 56 through the layer 54'. Including an inert material reduces the probability of shorting and provides a more consistent film/coating.

Moreover, at sufficiently low concentrations of tantalum, devices may be provided with higher switching voltages. It is anticipated that rather than using the oxide layer around the tantalum particles to act as the insulator, i.e., the potential barrier that electrons need to exceed in order to cause conduction, the barrier would be governed by the dielectric properties of the inert material, e.g., the titanium dioxide and the binder at the lower concentrations of tantalum.

Figure 5:
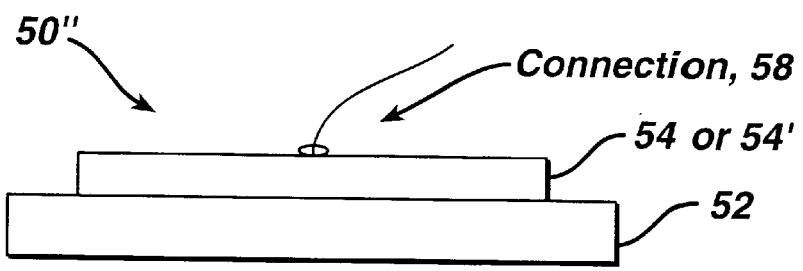
FIG. 5 is a cross-sectional view of another alternative M-I-M diode structure.

Referring now to FIG. 5, another embodiment 50" of the diode has the first electrode 52 and the metal-insulating layer 54 or 54' on the first electrode. This structure 50" may give similar diode properties when a connection 58 is made to the metal-insulating layer 54 or 54'. By eliminating the second electrode, the device 50" can have fewer layers, changing the fabrication process without substantially altering the characteristics of the metal insulator layer.

Figure 6:
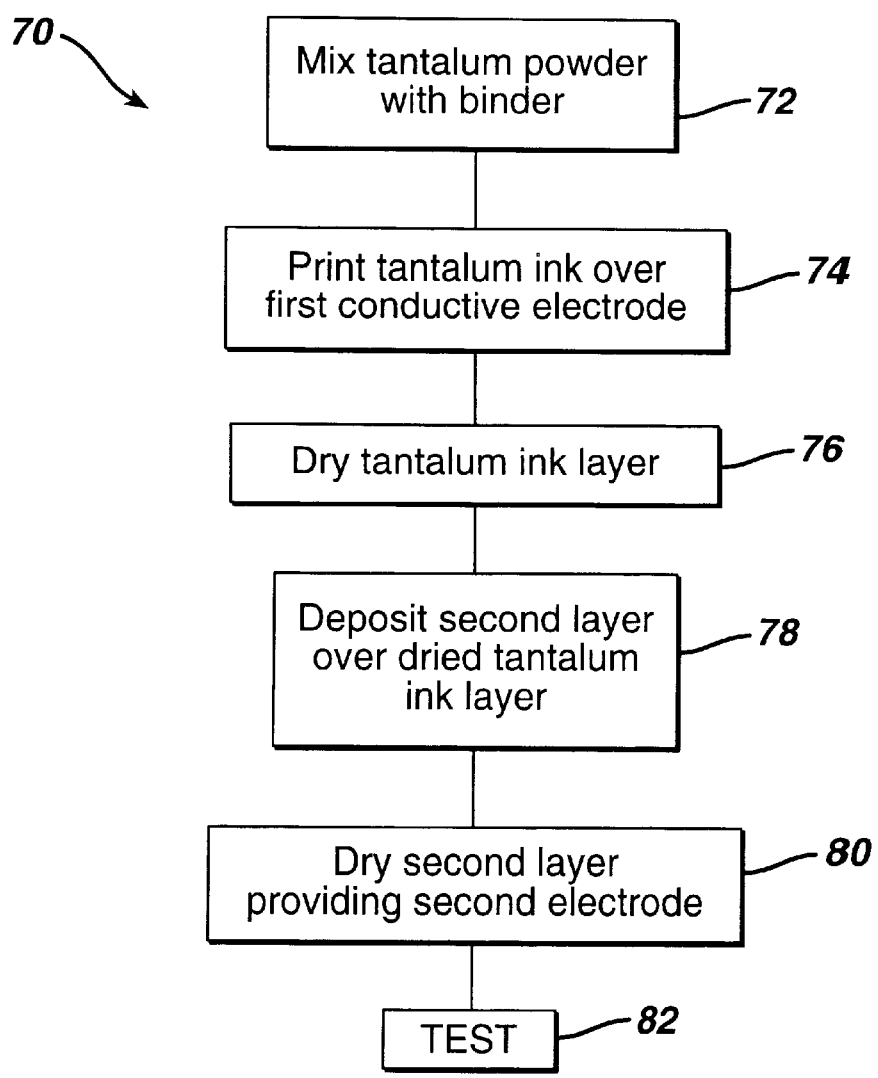
FIG. 6 is a flow chart of a process to manufacture the device of FIG. 3.

Referring now to FIG. 6, the device of FIG. 3 can be prepared as follows: The process 70 includes mixing 72 tantalum powder that is 99.97% pure, having the intrinsic oxide layer and having a particle size less than e.g., 5 microns, with a polymer binder such as Acheson, Electrodag No. 23DD146A, or Acheson SS24686, a more thixotropic material. Both polymer binders are available from Acheson, Port Huron, Mich. Other binders can be used with the tantalum to form a tantalum ink. The binders should be electrically insulating, stable with tantalum or the other metal used and preferably have an relatively high e.g., 15% to 35% or so solids content. The tantalum can be in a range of 100% to 39% of the total weight of the binder. Other ranges could be used. The tantalum particles and binder are mixed well to produce the tantalum ink. The tantalum ink is printed 74 on the first electrode e.g., a copper foil substrate or on other conductive material. The layer is printed, for example, by either draw down bars, screen printing, flexo or gravure printing techniques. The layer is dried 76, e.g., in an oven at 120° C. for 15–20 minutes. A second conductive layer such as chromium in the form of chromium particles mixed in a binder material is printed 78 on the tantalum binder layer. This chromium layer is also dried 80 at e.g., at 120° C. for 15–20 minutes producing the device 50. Thereafter, the device 50 can be tested 82.

Alternative conductive layers or metals such as copper, tungsten, molybdenum, carbon and so forth can be used for the first and/or second electrode. The conductivity of this layer can be varied by changing relative concentrations of conductive material to binder. Exemplary ranges for conductive material are 30% to 39%. By varying the conductivity of this layer, the shape of the current-voltage characteristic curve can be varied, making it a little sharper producing a diode having a steeper on/off response.

Processing is simplified because the tantalum particles used have an intrinsic oxide layer 60a. There is no need to thermally anneal or otherwise thermally preprocess the tantalum powder. The intrinsic oxide coating is very consistent in thickness and quality. This tends to produce very consistent metal-insulator layer materials and hence diodes with switching voltages having relatively low standard deviations over a series of diodes.

Another advantage is that since there is no need to thermally anneal the tantalum powder, the properties of the ink can be adjusted to achieve various diode properties to fit different applications. Ink formulation may be an easier process to control than thermal processing of the tantalum.

This device could also be referred to as a varistor, i.e., a thin printed varistor. This M-I-M structure is good for applications that need a nonlinear element that operates at low voltages and perhaps low current that can be printed rather than using semiconductor deposition techniques.

Figure 7A:
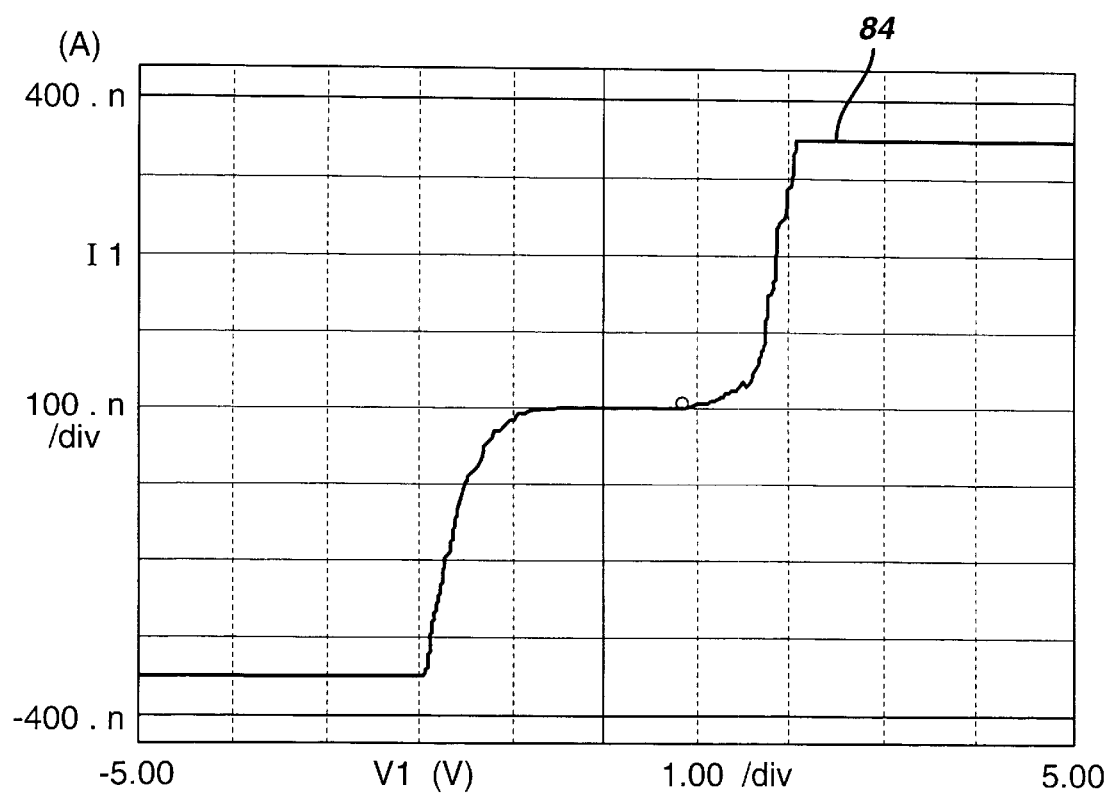
FIGS. 7A–7D are plots of voltage vs. current showing typical switching characteristics of M-I-M diode devices of FIGS. 1–4.

Referring now to FIGS. 7A–7D plots of voltage vs. current showing typical switching characteristics of M-I-M diode devices of FIGS. 3–5 are shown. As shown in FIG. 7A, a current voltage characteristic curve 84 for a M-I-M diode device exhibits a switching voltage at 100 na. (nanoamperes) of approximately 1.8 volts, with an on/off ratio that is calculated to be about 33. The current voltage characteristic curve 84 was obtained using a Hewlett Packard semiconductor analyzer, Model No. 4155B.

This device used a tantalum layer that was prepared by mixing 5 grams of tantalum particles obtained from Alfa Aesar, Ward Hill, Mass. having a particle diameter of less than 2 microns, with 20 grams of Electrodag 23DD146A polymer having a 25% solid versus 75% volatile compound composition. The ink was coated onto a conductive surface of copper foil using a 15 mil cutout i.e., to produce a layer having a wet thickness of 15 mils. The sample was dried in an oven at 120° C. for 20 minutes. The ink for the second layer of the diode was prepared by mixing 5 grams of chromium powder with a particle size of less than 5 microns as received from Alfa Aesar with 4 grams of Electrodag 23DD146A and was coated on top of the tantalum ink layer using a 5 mil cutout. This coating was dried for 20 minutes at 120° C.

Figure 7B:
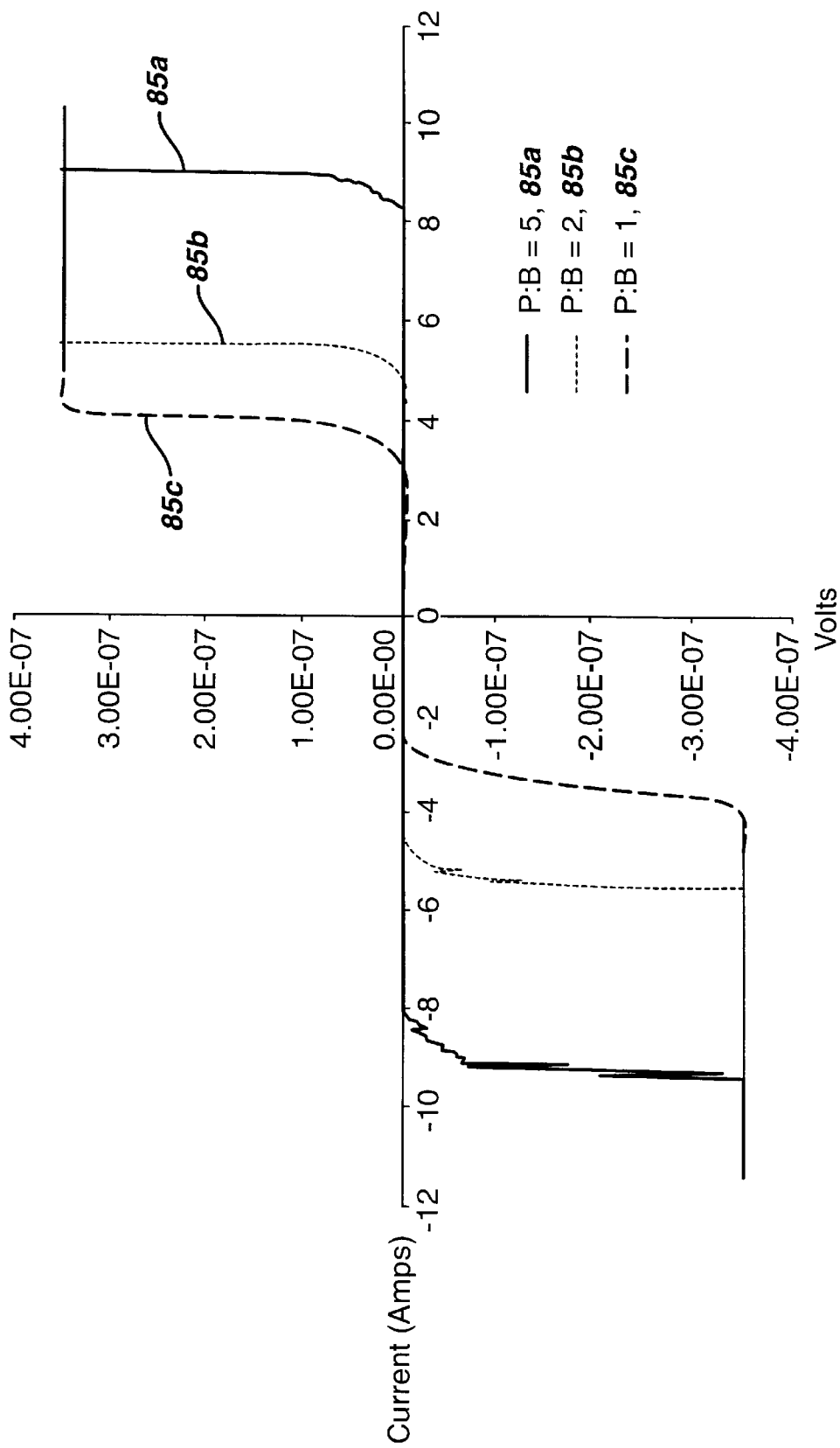

As shown in FIG. 7B, the M-I-M diodes can exhibit different switching voltages based upon different "P:B" ratios, that is, different ratios of metal (e.g., tantalum)

particles to binder. As shown in FIG. 7B, for the same thickness of 15 mils, with P:B ratios of 5, 2, and 1, devices exhibit switching voltages of approximately 9 volts (curve 85a), 5.3 volts (curve 85b) and 3.8 volts (curve 85c) at 100 nano amperes.

Figure 7C:
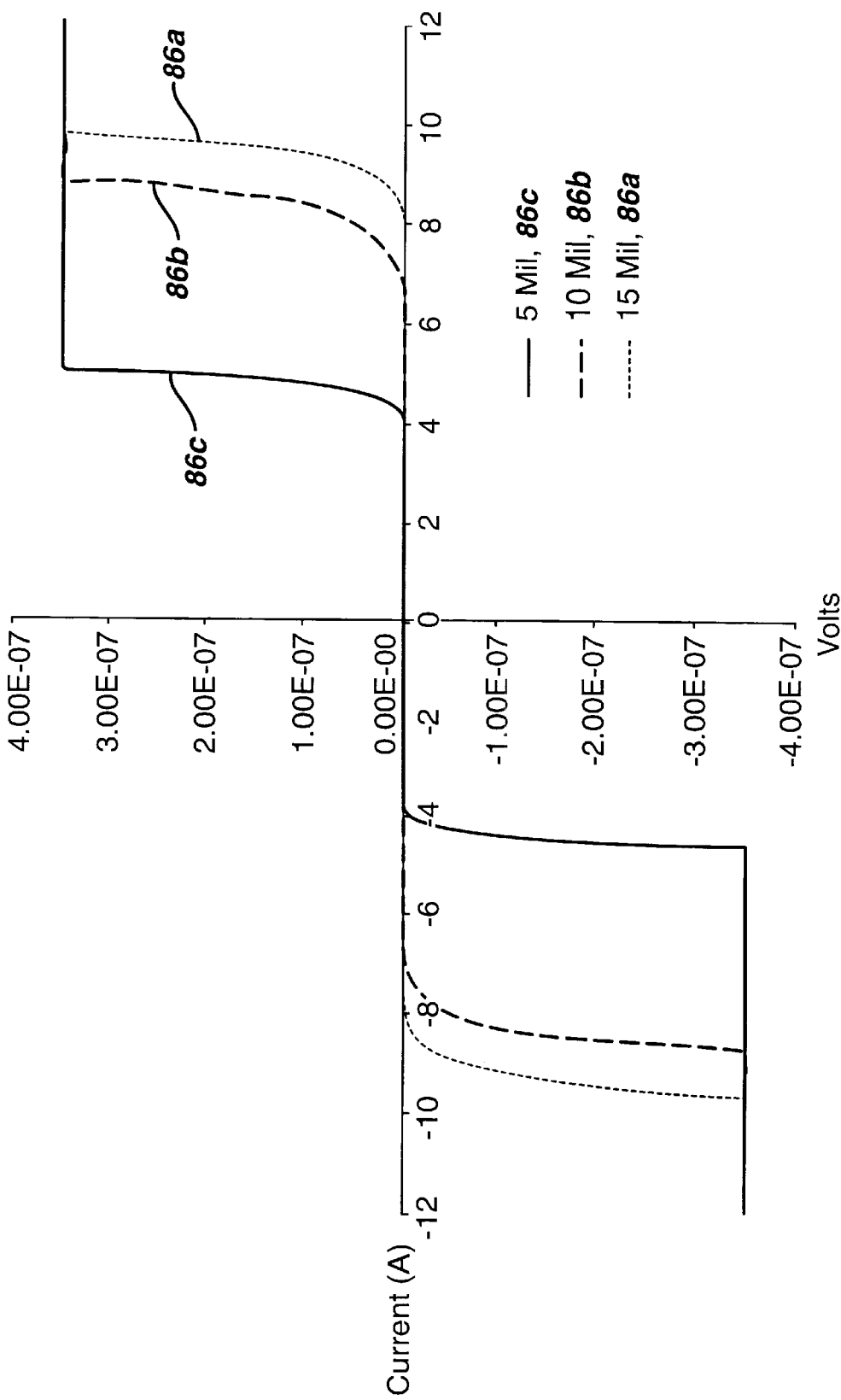

As also shown in FIG. 7C, varying the wet thickness of the tantalum layer can also produce varying switching voltages. With a tantalum layer having a tantalum to binder ratio (P:B) of 8:1, a M-I-M diode having a 15 mil thick tantalum layer would exhibit a switching voltage of approximately 9 volts (curve 86a), a 10 mil thick layer would provide a M-I-M diode with a switching voltage of approximately 7.8 volts (curve 86b), and a 5 mil thick layer would provide a M-I-M diode with a switching voltage of approximately 4.6 volts (curve 86b). Each of the switching voltages are measured at 100 nano amperes.

Figure 7D:
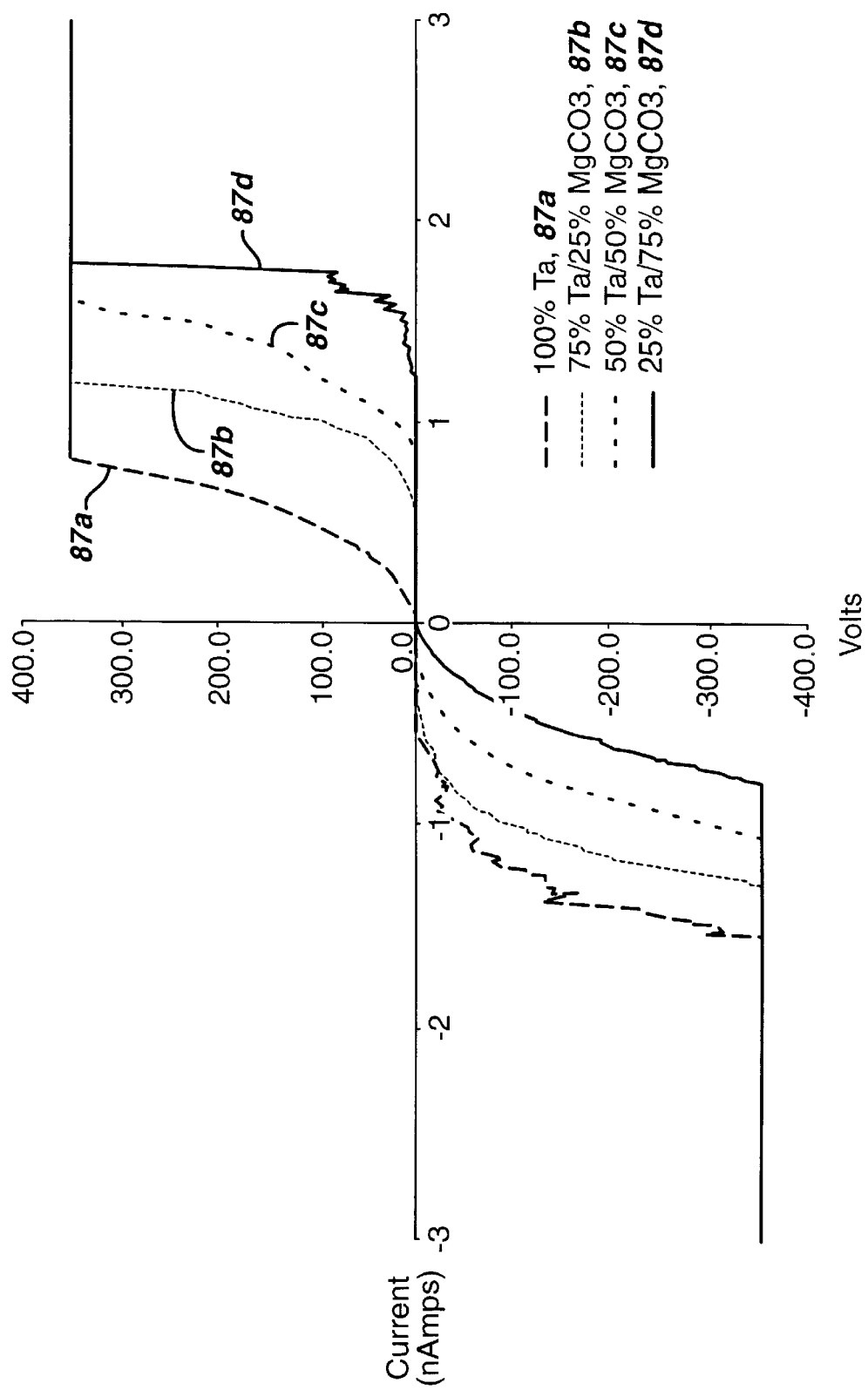

Referring now to FIG. 7D, addition of magnesium carbonate to the tantalum layer can produce M-I-M diodes that have consistently high on/off ratios with minimal impact on switching voltage. As shown in FIG. 7D, as the amount of magnesium carbonate is increased, the switching voltage characteristic becomes steeper. The curve 86a shows the switching characteristic for a 100% tantalum layer having a P:B ratio of 1:1 that exhibits switching voltage of 1.8 volts. Curves 87b–87d illustrate that as the amount of magnesium carbonate increases, the switching characteristic becomes steeper therefore indicating a better on/off ratio.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A voltage controlled display, comprises:
   a display element having a pair of electrodes;
   a voltage divider having a terminal coupled to a first one of the pair of electrodes of the voltage controlled display; and
   a metal-insulator-metal diode having a switching voltage less than about 10 volts coupled to the voltage divider, the metal-insulator-metal diode comprising:
      a first electrode of a conductive material;
      a composite metal-insulator layer comprised of metal particles suspended in a dielectric binding layer, the metal particles having an intrinsic oxide layer that covers the surface of the particles and is in contact with the binder layer; and
      a second electrode disposed on the composite metal-insulating layer comprised of a conductive materials, the second electrode disposed directly on the composite metal insulating layer to be in contact with the intrinsic oxide layer on the particles.

2. The voltage controlled display of claim 1 wherein the display element is an electrophoretic display.

3. The voltage controlled display of claim 1 wherein metal-insulator-metal diode has a switching voltage less than about 2 volts.

4. The voltage controlled display of claim 1 wherein the voltage divider includes a pair of resistors having the same resistance.

5. The voltage controlled display of claim 4 wherein a voltage potential at the first terminal of the display element is a fraction of a signal line voltage and a potential at the second terminal of the display element is determined by a voltage across the nonlinear element and resistor.

6. The voltage controlled display of claim 1 further comprising a second metal-insulator-metal device and wherein the voltage divider includes a resistor coupled in series with the second metal-insulator-metal diode.

7. The voltage controlled display of claim 6 wherein a voltage potential at the first terminal of the display element is a fraction of a signal line voltage and a potential at the second terminal of the display element is determined by a voltage at a connection of the nonlinear element and resistor.

8. The voltage controlled display of claim 1 wherein the voltage of one of the terminals of the display element will vary with respect to the voltage at the other terminal of the display element in accordance with display control signals fed to the display element.

9. The voltage controlled display of claim 8 wherein the metal-insulator-metal diode will switch states causing the voltage at one terminal of the display element to become negative with respect to the voltage at the other terminal of the display element to cause a change in color of the display element.

10. A voltage controlled display comprising:
    a plurality of display cells coupled in an array, each cell comprising:
    a display element having a pair of electrodes;
    a voltage divider having a terminal coupled to a first one of the pair of electrodes of the voltage controlled display; and
    a metal-insulator-metal diode having a switching voltage less than about 10 volts coupled to the voltage divider, the metal-insulator-metal diode comprising:
       a first electrode of a conductive material;
       a composite metal-insulator layer comprised of metal particles suspended in a dielectric binding layer, the metal particles having an intrinsic oxide layer that covers the surface of the particles and is in contact with the binder layer; and
       a second electrode disposed on the composite metal-insulating layer comprised of a conductive materials, the second electrode disposed directly on the composite metal insulating layer to be in contact with the intrinsic oxide layer on the particles.

11. The voltage controlled display of claim 10 wherein the display element is an electrophoretic display.

12. The voltage controlled display of claim 10 wherein the metal-insulator-metal diode has a switching voltage less than 2 volts.

13. The voltage controlled display of claim 10 wherein each cell has a pair of terminals coupled to respectively either row or column lines of the array.

14. The voltage controlled display of claim 10 wherein the row or column lines of the array are provided from row and column driver circuits that are fed by signals to address and control the display.

15. The voltage controlled display of claim 10 wherein one electrode of each of the display elements is coupled to a fixed voltage.

16. The voltage controlled display of claim 10 wherein a voltage potential at the first terminal of each of the display elements is some fraction of a display supply voltage and a potential at the second terminal of the display is determined by voltage across the nonlinear element and resistor.

17. The voltage controlled display of claim 10 wherein as the voltage of the second terminal of one of the plurality of display elements varies with respect to the other, it causes the display to change color when there exists an opposite potential difference across the display.

\* \* \* \* \*

UNITED STATES PATENT AND TRADEMARK OFFICE
CERTIFICATE OF CORRECTION

PATENT NO.   : 6,380,922 B1
DATED        : April 30, 2002
INVENTOR(S)  : Jeffrey S. Hewes, Anne T. Lynch and Mark Kacprowicz It is certified that error appears in the above-identified patent and that said Letters Patent is hereby corrected as shown below:

<u>Title page,</u>
Item [56], OTHER PUBLICATIONS, replace "?Electrophoretic Displays" and insert -- "Electrophoretic Displays" --.

Signed and Sealed this

Twenty-eighth Day of January, 2003

JAMES E. ROGAN
*Director of the United States Patent and Trademark Office*